United States Patent [19]
Larson et al.

[11] Patent Number: 5,359,220
[45] Date of Patent: Oct. 25, 1994

[54] HYBRID BIPOLAR/FIELD-EFFECT POWER TRANSISTOR IN GROUP III-V MATERIAL SYSTEM

[75] Inventors: Lawrence E. Larson, Santa Monica; Peter Asbeck, San Diego; Julia J. Brown, Santa Monica, all of Calif.

[73] Assignee: Hughes Aircraft Company, Los Angeles, Calif.

[21] Appl. No.: 994,734

[22] Filed: Dec. 22, 1992

[51] Int. Cl.$^5$ .................... H01L 27/07; H01L 29/205
[52] U.S. Cl. ..................................... 257/378; 257/192; 257/197; 257/20; 257/24
[58] Field of Search ............... 257/273, 27, 192, 195, 257/370, 378, 256, 144, 197, 20, 24

[56] References Cited

U.S. PATENT DOCUMENTS

| | | | |
|---|---|---|---|
| 4,320,410 | 3/1982 | Nishizawa et al. | 257/273 |
| 4,495,513 | 1/1985 | Descamps | 257/144 |
| 5,068,705 | 11/1991 | Tran | 257/197 |

OTHER PUBLICATIONS

"Power Transistors: Device Design and Application", edited by B. Jayant Baliga et al, IEEE Press 1984, pp. 354–363.
"Ultra–High–Speed Modulation–Doped Field–Effect Transistors: A Tutorial Review", L. D. Nguyen et al., Proceedings of the IEEE, vol. 80, No. 4, Apr. 1992, pp. 494–518.

*Primary Examiner*—Rolf Hille
*Assistant Examiner*—David B. Hardy
*Attorney, Agent, or Firm*—Vijayalakshmi D. Duraiswamy; Wanda K. Denson-Low

[57] ABSTRACT

A hybrid power transistor (40) includes a vertical PNP bipolar transistor (42) having a floating base (46). A junction-gate type field-effect transistor (FET) (62) has a lateral N-type channel (64,66) and a vertical electron injection path (54) from the channel (64,66) into the base (46) of the bipolar transistor (42). The FET channel current and thereby the electron injection current are controlled by the FET gate voltage. The injection current conductivity modulates the base (46) and thereby controls the collector current of the bipolar transistor (42). The FET (62) may have a high electron mobility transistor (HEMT), junction-gate field-effect transistor (JFET) or metal-semiconductor field-effect transistor (MESFET) structure. The FET (62) does not require a gate insulating layer, enabling fabrication of the hybrid transistor (40) in the group III–V material system.

45 Claims, 3 Drawing Sheets

HYBRID BIPOLAR/FIELD-EFFECT POWER TRANSISTOR IN GROUP III-V MATERIAL SYSTEM

BACKGROUND OF THE INVENTION

1. Field of the Invention

The present invention generally relates to power transistors, and more specifically to a hybrid bipolar/-field-effect power transistor fabricated in the group III-V material system.

2. Description of the Related Art

The insulated gate bipolar transistor (IGBT) is a hybrid power transistor which offers the high input impedance and low input current of a field-effect transistor, together with the high current capability of a bipolar transistor. A general description of the IGBT is presented in a textbook entitled "POWER TRANSISTORS: DEVICE DESIGN AND APPLICATIONS", edited by B. Jayant Baliga et al, IEEE Press, 1984, pp. 354-363.

A conventional IGBT 10 is illustrated in FIG. 1, and is fabricated in silicon. The IGBT 10 includes a bipolar PNP type transistor section 12 including a P+ emitter layer 14, an N− base or drift layer 16 and a plurality of laterally spaced P+ collector layers 18. Portions of the base layer 16 extend upwardly into the lateral gaps between the collector layers 18 to constitute vertical injection regions 20.

An anode terminal 22 is ohmically connected to the emitter layer 14 via a metal contact layer 24. N+ regions 26 are formed in the opposite end portions of the collector layers 18, and provide ohmic contact between the layers 18 and cathode terminals 28 via metal contacts 30.

The IGBT 10 further includes a field-effect transistor (FET) section 31 including a plurality of insulated gate FET structures 32. Each structure 32 includes a gate insulator layer 33 which is formed of silicon dioxide or silicon nitride and extends over the underlying injection region 20 between adjacent N+ regions 26. A gate metal layer 34 is formed over each insulator layer 33 to provide a metal-oxide-semiconductor (MOS) gate structure.

The metal layers 34 are connected to gate terminals 36. For high power operation, the cathode terminals 28 are connected together and the gate terminals 36 are connected together. The cathode terminals 28 are grounded, and a positive voltage is applied to the anode terminal 22.

With zero voltage applied to the gate terminals 36, lateral channels 38 defined in the upper portions of the collector layers 18 under the gate insulator layers 33 between the adjacent lateral edges of the N+ regions 26 and the collector layers 18 are depleted of electrons, and no electron current flows through the channels 38.

Application of a sufficiently high positive voltage to the gate terminals 36 enhances (attracts electrons into) the channels 38 and the upper portions of the injection regions 20 which constitute extensions of the channels 38. This creates a lateral conduction path from the N+ regions 26 into the injection regions 20 through the channels 38.

Electrons are injected from the cathode terminals 28 through the lateral conduction path from which they are vertically injected into the injection regions 20. The electrons drift downwardly from the regions 20 through the base layer 16 and emitter layer 14 toward and are collected at the anode terminal 22. The electron flow through the base layer 16 increases the conductivity thereof, and causes holes to be back injected from the anode 22 and emitter layer 14 into the base layer 16, from which they flow through the collector layers 18 to the cathode terminals 28.

The hole current from the anode terminal 22 through the emitter layer 14, base layer 16 and collector layers 18 to the cathode terminals 28 constitutes the main power current of the IGBT 10. The base layer 16 is conductivity modulated by the electron current which is vertically injected into the regions 20 from the channel regions 38 of the FET section 31. The larger the electron injection current, the higher the conductivity of the base layer 16 and the higher the hole current of the bipolar transistor section 12.

The FET section 31 has an insulated gate or MOS structure, as this enables the highest power operation of the various field-effect transistor configurations using silicon technology. However, the conventional silicon IGBT has relatively low electron mobility, which produces a high forward voltage drop across the device and accompanying power loss.

In addition, the low bandgap of silicon produces a relatively low breakdown voltage. Another problem inherent in silicon IGBTs is a latch-up phenomenon caused by parasitic NPN transistor or PNPN thyristor action. These drawbacks prevent the silicon IGBT from being used in applications such as power switches in which these limitations are unacceptable.

Transistor devices fabricated in group III-V material systems, including gallium arsenide (GaAs) and indium phosphide (InP), have higher electron mobility, higher breakdown voltage, higher operating speed and lower losses. However, the IGBT design cannot be practically implemented in a group III-V material system as it requires the gate insulator layers 33 which are difficult or impossible to fabricate on group III-V materials.

SUMMARY OF THE INVENTION

A hybrid power transistor embodying the present invention includes a vertical PNP bipolar transistor having a floating base. A junction-gate type field--effect transistor (FET) has a lateral N-type channel and a vertical electron injection path from the channel into the base of the bipolar transistor.

The FET channel current and thereby the electron injection current are controlled by the FET gate voltage. The injection current conductivity modulates the base and thereby controls the collector current of the bipolar transistor. The FET may have a high electron mobility transistor (HEMT), junction-gate field-effect transistor (JFET) or metal-semiconductor field-effect transistor (MESFET) structure.

The junction-gate FET of the present transistor does not require a gate insulating layer, enabling fabrication of the transistor in a group III-V material system. This enables the present transistor to embody the advantages of group III-V devices, including higher electron mobility, higher current density, higher breakdown voltage, higher operating speed and lower losses than the prior art IGBT.

The HEMT configuration has a channel and gate structure including a doped, wide bandgap material layer formed over a substantially intrinsic narrow bandgap material layer. These two layers form a heterojunction. This embodiment of the invention is designated as a "heterojunction gate bipolar transistor (HGBT)".

The present hybrid transistor, especially in the HEMT configuration, is substantially less prone to latch-up than the IGBT. The narrow bandgap layer reduces the emitter efficiency of the parasitic NPN transistor, thereby reducing its current gain and latch-up tendency. With appropriate design, the present transistor can be made substantially latch-up free.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
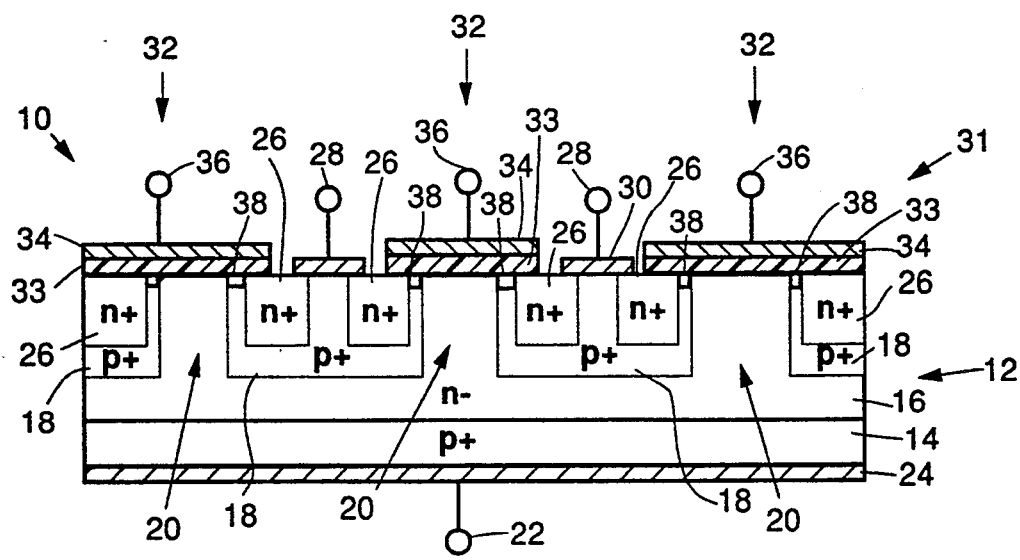
FIG. 1 is a simplified sectional view illustrating a prior art insulated-gate bipolar transistor (IGBT)
Figure 2:
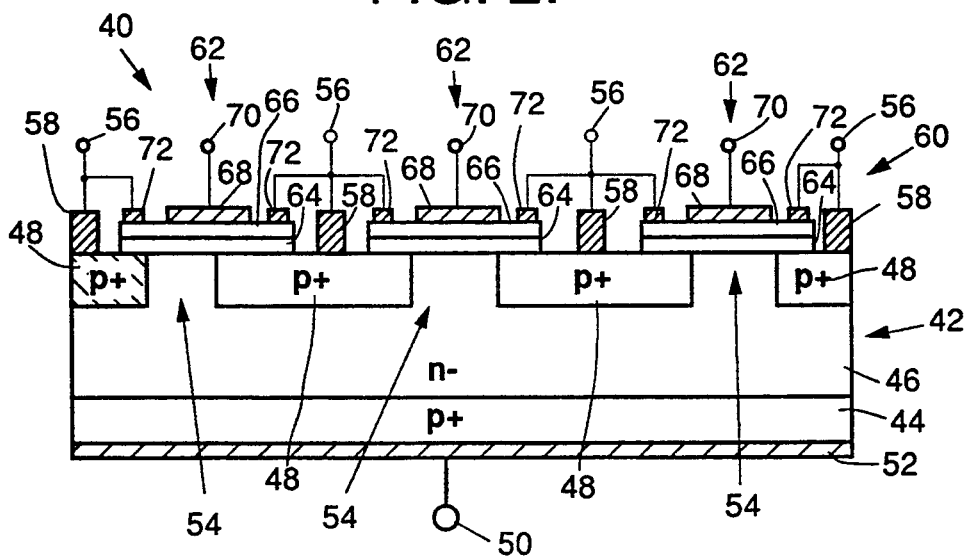
FIG. 2 is a simplified sectional view illustrating a hybrid bipolar/field-effect transistor embodying the present invention including a high electron mobility transistor (HEMT) or dual doped layer metal-semiconductor transistor (MESFET) channel structure.

A hybrid power transistor 40 embodying the present invention is illustrated in FIG. 2. The transistor 40 includes a PNP bipolar transistor section 42 including a P+ emitter layer 44, an N− base or drift layer 46, and laterally spaced collector layers 48 which are analogous to the layers 14, 16 and 18 of the IGBT 10 as described above with reference to FIG. 1.

The bipolar transistor section 42 is preferably fabricated in the group III-V material system, with the layers 44, 46 and 48 being formed of gallium arsenide (GaAs) or indium phosphide (InP). An anode terminal 50 is connected to the emitter layer 44 via a metal contact layer 52.

Portions of the base layer 46 extend upwardly into the lateral gaps between adjacent collector layers 48 to define vertical electron injection regions 54. Cathode terminals 56 are ohmically connected to the collector layers 48 via metal contacts 58.

The transistor 40 further includes an FET section 60 including a plurality of FET structures 62. Each structure 62 has a heterojunction channel including a substantially intrinsic lower layer 64 of a narrow bandgap material, preferably gallium indium arsenide (GaIAs), and an N-type upper layer 66 of a wide bandgap material, preferably aluminum gallium arsenide (AlGaAs) or aluminum indium arsenide (AlInAs). A Schottky metal gate 68 is formed on each layer 66 and connected to a gate terminal 70. Due to the heterojunction structure, the transistor 40 is designated as a "heterojunction gate bipolar transistor (HGBT)".

The layers 64 and 66 and gate 68 of each FET structure 62 have the configuration of a high electron mobility transistor (HEMT). The transistor 40 further includes ohmic contacts 72 which are formed on the opposite ends of the layers 66 and are connected to the cathode terminals 56.

For high power operation, the cathode terminals 56 are grounded and a positive voltage is applied to the anode terminal 50. The FET section 60 is preferably operated in depletion mode, with a negative control signal applied to the gate terminals 70, although enhancement mode operation is also possible.

The operation of the transistor 40 will be described with reference also being made to FIG. 3. With a sufficiently negative signal applied to the gate terminals 70, the Schottky junction of the layer 66 and gate 68 is reverse biased and the layer 64 is depleted of electrons, such that no electrons are injected from the FET structures 62 into the injection regions 54.

When the negative gate voltage reduced to a sufficient level, the reverse bias of the Schottky junction is reduced and the depletion of the layer 64 is also reduced to an extent that a two-dimensional electron gas (2DEG) layer 74 is formed in the layer 64 just below the interface with the layer 66. The 2DEG layer 74 provides a lateral conduction path between the contacts 72 at the opposite ends of each layer structure 64,66. Electrons are injected from the cathode terminals 72 into the 2DEG layer 74 as indicated by arrows 76, flow through the layer 74, and are injected vertically into the injection regions 54 as indicated by arrows 78.

The injected electrons drift downwardly through the base layer 46 and emitter layer 44 and are collected at the anode terminal 50. This causes back injection of holes from the emitter layer 44 into the base layer 46 as indicated by arrows 80. The injected holes flow upwardly through the collector layers 48 to the cathode terminals 56.

The hole current from the anode terminal 50 through the emitter layer 44, base layer 46 and collector layers 48 to the cathode terminals 56 constitutes the main power current of the transistor 40. The base layer 46 is conductivity modulated by the electron current which is vertically injected into the regions 54 from the 2DEG layer 74 of the FET structures 62. The larger the electron injection current, the higher the conductivity of the base layer 46 and the higher the hole current of the bipolar transistor section 42.

It will be noted that although each FET structure 62 has a source (one of the contacts 72), a lateral channel (layers 64 and 66) and a drain (the other of the contacts 72), the source and drain are both connected to ground (the cathode terminals 56). In the present configuration, therefore, each FET structure 62 can be considered as constituting two FETs, with a source (one of the contacts 72), a channel (the lateral half of the layers 64,66 connected to the respective contact 72) and a drain (the lateral half of the upper portion of the respective injection region 54). The injected electrons flow laterally from the source into the channel, and vertically from the channel into the drain.

It will be further noted that the operation of the transistor 40 is facilitated by the symmetrical arrangement as illustrated in which one N-channel FET structure 62 is provided for injecting electrons into two vertical PNP bipolar transistors on opposite lateral sides of the respective FET structure 62. However, it is theoretically possible, and within the scope of the invention, to fabricate a hybrid transistor including only one vertical bipolar transistor and one FET.

The electron mobility in the HEMT heterojunction channel and gate configuration is extremely high, at least an order of magnitude higher than in the prior art silicon IGBT. The high electron mobility produces a lower forward voltage drop and higher current density than are possible with the IGBT.

In addition, the narrow bandgap material of the upper channel layers 66 reduces the emitter injection efficiency of the parasitic NPN transistor constituted by the base layer 46, collector layers 48 and channel layers 66, reducing its current gain and producing substantially latch-up free operation. The transistor 40 also benefits from the inherent advantages of group III-V devices, including high breakdown voltage and high operating speed.

The preferred dimensions and doping concentrations for the transistor 40 are given below, but should not be considered as limiting the scope of the invention.

The emitter layer 44 is 0.5-2.0 micrometers thick, with the preferred thickness being 1.0 micrometer. The layer 44 is doped with beryllium (Be) or zinc (Zn) to a concentration of $5 \times 10^{18} - 5 \times 10^{19}$ ions/cm$^3$ with the preferred concentration being $10^{19}$.

The base layer 46 is 20-30 micrometers thick with the preferred thickness being 25 micrometers. The layer 46 is doped as lightly as possible, preferably intrinsic, with the impurity concentration being less than $10^{14} - 10^{15}$ ions/cm$^3$.

The collector layers 48 are 3,000-8,000 angstroms thick, with the preferred thickness being 5,000 angstroms. The length of the lateral gap (the horizontal length of the injection regions 54 as viewed in FIGS. 2 and 3) is 2-10 micrometers. The layers 48 are doped with beryllium or zinc to a concentration of $5 \times 10^{18} - 5 \times 10^{19}$ ions/cm$^3$, with the preferred concentration being $10^{19}$.

The narrow bandgap channel layer 64 is intrinsic and 200-1,000 angstroms thick, with the preferred thickness being 500 angstroms. The wide bandgap channel layer 66 is 500-2,000 angstroms thick, with the preferred thickness being 1,000 angstroms. The layer 66 is doped with silicon (Si) to a concentration of $2 \times 10^{17} - 2 \times 10^{18}$ ions/cm$^3$, with the preferred concentration being $5 \times 10^{17}$.

The FET structures 62 can alternatively be embodied as metal-semiconductor transistor (MESFET) structures having dual channel layers using the same materials as the HEMT configuration by selecting different layer thicknesses and doping concentrations. In the MESFET embodiment, the layer 64 functions as an N-type channel layer, whereas the layer 66 functions as a Schottky layer. Electrons are vertically injected from the layer 64 into the injection regions 54 to conductivity modulate the base layer 46 as described above.

For the dual channel layer MESFET configuration, the layer 64 is 300-1,000 angstroms thick, with the preferred thickness being 500 angstroms. The layer 64 is doped with silicon (Si) to a concentration of $2 \times 10^{17} - 10^{18}$ ions/cm$^3$, with the preferred concentration being $5 \times 10^{17}$. The layer 66 is undoped and has a thickness of 1,000-3,000 angstroms, with the preferred thickness being 2,000 angstroms.

Figure 3:
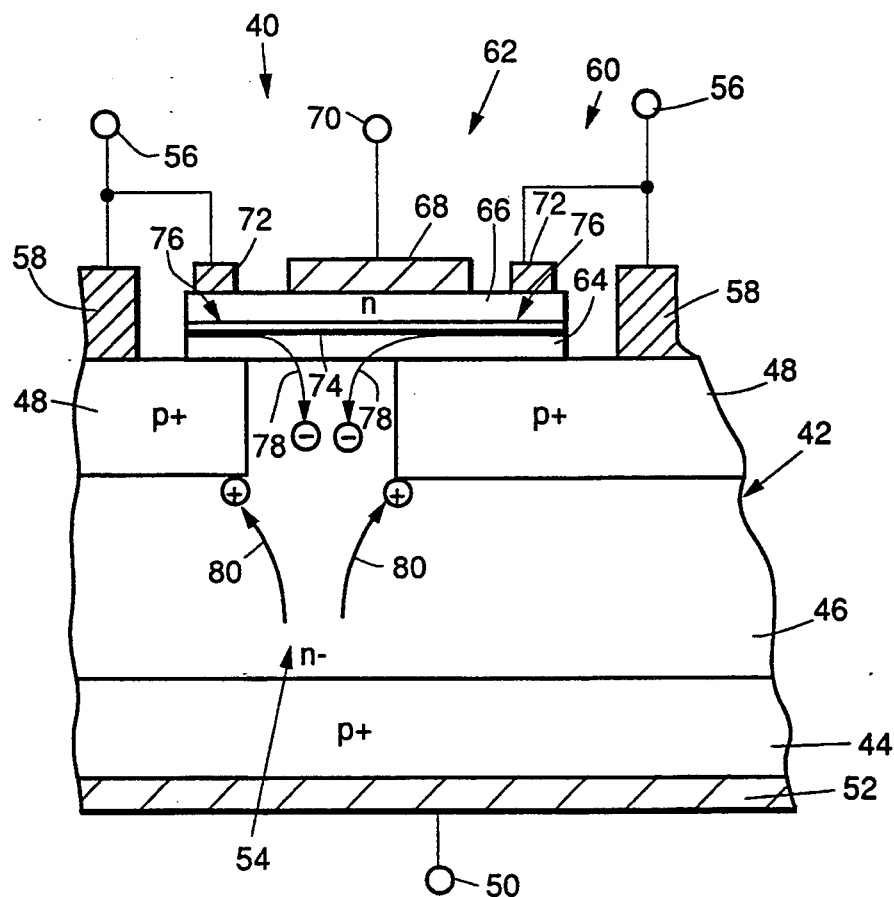
FIG. 3 is an enlarged sectional view illustrating electron and hole flow in the transistor of FIG. 2.
Figure 4:
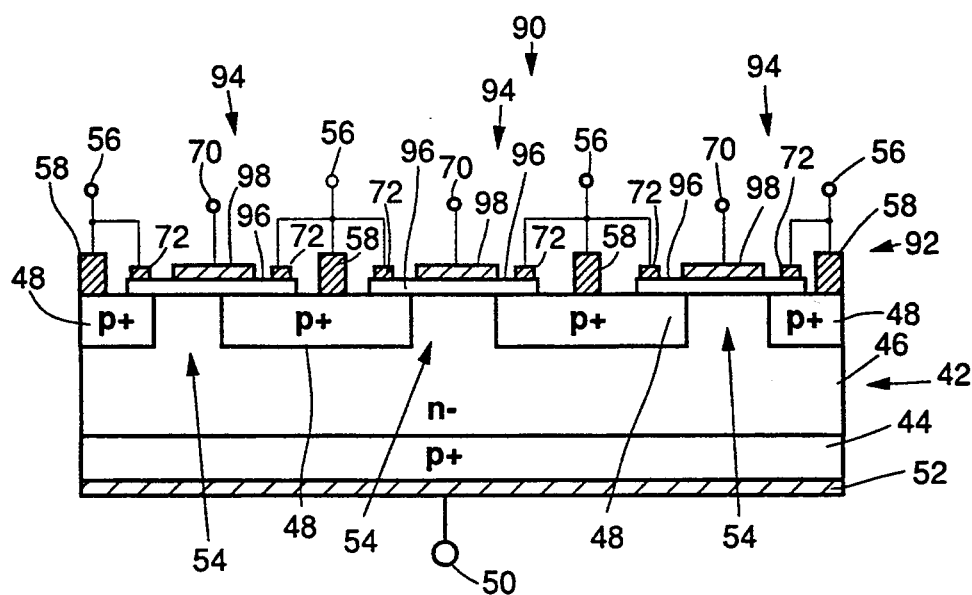
FIG. 4 is a simplified sectional view of a hybrid bipolar/field-effect transistor embodying the present invention including a single doped layer MESFET channel structure.

FIG. 4 illustrates another hybrid transistor 90 embodying the present invention, in which like elements are designated by the same reference numerals as in FIGS. 2 and 3. The transistor 90 has an FET section 92 including FET structures 94. In the transistor 90, the structures 94 have a single channel layer MESFET configuration, including an N-type channel layer 96 and a Schottky gate 98.

The channel layers 96 are 5,000-10,000 angstroms thick, with the preferred thickness being 7,500 angstroms. The layers 96 are doped with silicon to a concentration of $5 \times 10^{17} - 10^{18}$ ions/cm$^3$ with the preferred concentration being $7.5 \times 10^{17}$. Although not illustrated in detail, the Schottky gates 98 preferably include a lower layer of a refractory metal such as titanium which forms a Schottky barrier with the layer 96, and overlying ohmic contact layers of platinum and gold.

Figure 5:
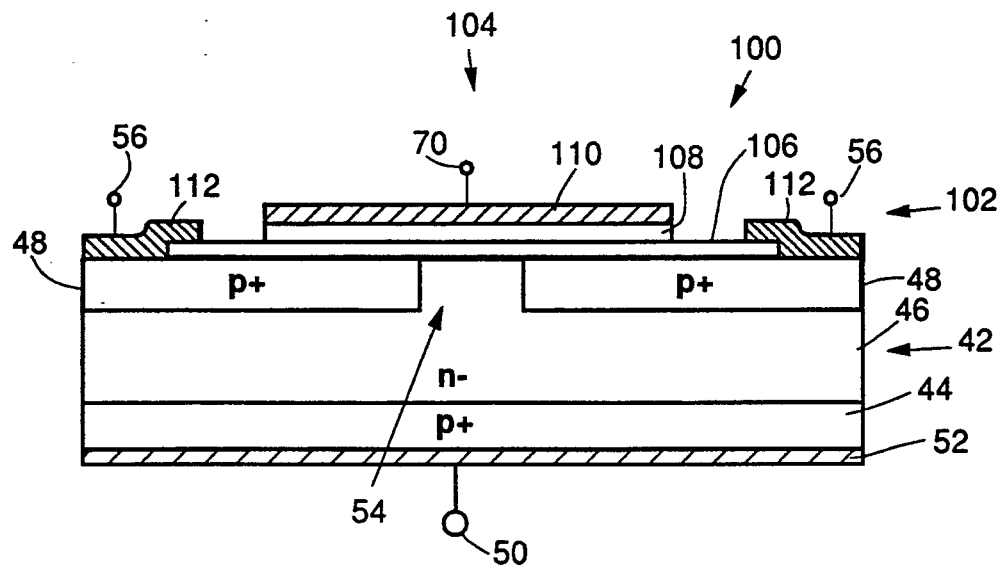
FIG. 5 illustrates a hybrid bipolar/field-effect transistor embodying the present invention including a junction field-effect transistor (JFET) channel and gate structure with vertical modulation.

FIG. 5 illustrates another hybrid transistor 100 embodying the invention, having an FET section 102 including FET structures 104 with a junction field-effect transistor (JFET) configuration. Each structure 104 includes an N-type layer 106 and a P-type layer 108 which form a P-N diode junction. An ohmic contact layer 110 is formed over the P-type layer. Ohmic contacts 112 are connected to the opposite ends of the N-type layer 106, as well as to the underlying collector layers 48 and cathode terminals 56.

The transistor 100 may be fabricated as a homostructure in a single group III-V material, preferably GaAs or InP. The N-type layer 106 is 3,000-6,000 angstroms thick, with the preferred thickness being 4,500 angstroms. The layer 106 is doped with selenium (Se), silicon or tin (Sn) to a concentration of $5 \times 10^{16} - 2 \times 10^{17}$ ions/cm$^3$, with the preferred concentration being $8 \times 10^{16}$ ions/cm$^3$.

The layer 108 is 2,500-5,000 angstroms thick, with the preferred thickness being 3,000 angstroms. The layer 108 is doped with beryllium or zinc to a concentration of concentration of $10^{18} - 10^{19}$ ions/cm$^3$ with the preferred concentration being $5 \times 10^{18}$ ions/cm$^3$.

Figure 6:
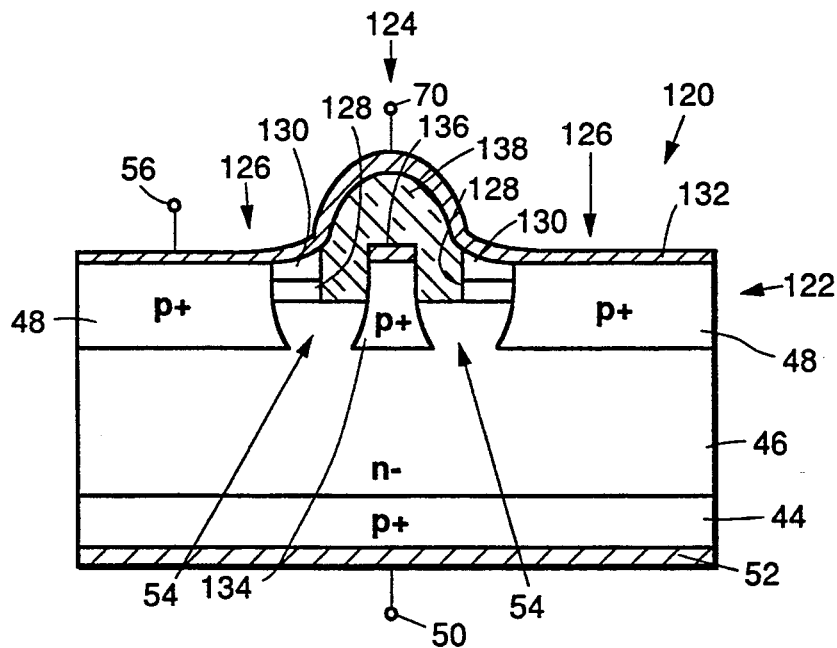
FIG. 6 illustrates a hybrid bipolar/field-effect transistor embodying the present invention including a junction field-effect transistor (JFET) channel and gate structure with lateral modulation.

Whereas the hybrid transistors embodying the present invention described above include FET structures which operate with vertical modulation, FIG. 6 illustrates a transistor 120 including an FET section 122 having FET structures 124 operating with lateral modulation. This arrangement can be embodied in the HEMT, single or dual channel layer MESFET or JEFET configuration.

The JFET configuration is illustrated in FIG. 6 as including two laterally spaced channel sections 126. Each section 126 includes an N-type channel layer 128 and an N+ contact layer 130 which is connected via a metallization 132 to the cathode terminals 56. The layers 128 and 130 are spaced laterally, rather than vertically as in the arrangement of FIG. 5, from the respective collector layers 48. The layers 128 are 1,000-2,000 angstroms thick, with the preferred thickness being 1,500 angstroms. The layer 128 is doped with beryllium to a concentration of $5 \times 10^{18} - 10^{19}$, with the preferred concentration being $7.5 \times 10^{18}$.

Each FET structure 124 further includes a P+ layer 134 which can be fabricated simultaneously with the collector layers 48. The layer 134 is connected to the respective gate electrode 70 via a Schottky metal contact layer 136. The space surrounding the layers 134 and 136 and underlying a central portion of the metallization 132 which extends over the layers 134 and 136 is filled with an insulating polyamide material 138.

The operation of the transistor 124 is similar to that of the transistor 104 illustrated in FIG. 5, except that the channel layer 128 is modulated laterally, rather than vertically, by the electric field extending from the P+ layer 134 and that portions of the injection regions 54 and insulating material 138 intervene between the channel layers 128 and the respective layers 134. The lateral modulation configuration ensures that the transistor 124 can be turned off hard due to the reduced lengths of the depletion regions in the channel layers 128 in the OFF state of the transistor 124.

The method of fabricating a hybrid transistor as described above is not the particular subject matter of the present invention and will not be described in detail. However, the transistors illustrated in FIGS. 2 to 5 are most readily fabricated using epitaxial deposition and patterning for the semiconductor layers, whereas the transistor illustrated in FIG. 6 is most readily fabricated using epitaxial deposition of the layers 44 and 46 and ion implantation of the other layers.

While several illustrative embodiments of the invention have been shown and described, numerous variations and alternate embodiments will occur to those skilled in the art, without departing from the spirit and scope of the invention.

For example, although the present hybrid transistor has been described and illustrated as including a PNP bipolar transistor section and an N-channel FET section, it is within the scope of the invention to reverse the applicable conductivity types and voltages to provide a hybrid transistor including an NPN bipolar transistor section and a P-channel FET section.

Further, a junction-gate FET of either channel conductivity type operating in either enhancement or depletion mode can be combined with a bipolar transistor of either conductivity type as long as the FET injects charge carriers of the required polarity into the base of the bipolar transistor for conductivity modulation. It is yet further within the scope of the invention to fabricate a hybrid transistor in a material system other than group III-V, such as silicon.

Accordingly, it is intended that the present invention not be limited solely to the specifically described illustrative embodiments. Various modifications are contemplated and can be made without departing from the spirit and scope of the invention as defined by the appended claims.

We claim:

1. A hybrid transistor, comprising:
vertical bipolar transistor means having a collector, an emitter and a floating base; and
junction-gate type field-effect transistor means having a gate, a lateral channel overlying said floating base, means for directing a lateral current flow through said channel, and a vertical charge carrier injection path from the channel into the underlying base of said vertical bipolar transistor means, said vertical charge carrier injection path being modulated in response to a signal applied to said gate, and said gate, channel and means for directing current through said channel each being spatially separated from said vertical bipolar transistor means,
in which the bipolar transistor means and the field-effect transistor means are formed of group III-V materials.

2. A hybrid transistor, comprising:
vertical bipolar transistor means having a collector, an emitter and a floating base; and
junction-gate type field-effect transistor means having a gate, a lateral channel overlying said floating base, means for directing a lateral current flow through said channel, and a vertical charge carrier injection path from the channel into the underlying base of said vertical bipolar transistor means, said vertical charge carrier injection path being modulated in response to a signal applied to said gate, and said gate, channel and means for directing current through said channel each being spatially separated from said vertical bipolar transistor means,
in which the channel comprises a heterojunction structure.

3. A hybrid transistor as in claim 2, in which the field-effect transistor means comprises a junction field-effect transistor (JFET) structure.

4. A hybrid transistor as in claim 2, in which said emitter has an emitter layer of one conductivity type to said emitter layer formed over the emitter layer; and said collector has two laterally spaced collector layers of like conductivity to said emitter layer which are formed over the base layer and define a lateral gap therebetween, a portion of the base layer extending into said gap to constitute an injection region, and said lateral channel of said junction-gate type field-effect transistor means is of opposite conductivity to said emitter layer overlying said portion of the floating base layer which constitutes the injection region, and said gate of said junction-gate type field-effect transistor means is formed over the channel, the gate controlling vertical injection of electrons from the channel into said injection regions of the base layer and thereby modulating the flow of current through the base layer, and
said emitter layer is N-type and the channel comprises a junction field-effect transistor (JFET) structure including:
an N-type layer formed over the injection region; and
a P-type layer formed over the N-type layer.

5. A hybrid transistor as in claim 4, in which the N-type layer and the P-type layer of said channel are formed of a group III-V material.

6. A hybrid transistor as in claim 4, in which the N-type layer and the P-type layer of said channel are formed of a material selected from the group consisting of gallium arsenide (GaAs) and indium phosphide (InP).

7. A hybrid transistor as in claim 4, in which the N-type layer of said channel has a thickness of approximately 3,000–6,000 angstroms.

8. A hybrid transistor as in claim 4, in which the N-type layer of said channel has a thickness of approximately 4,500 angstroms.

9. A hybrid transistor as in claim 4, in which the N-type layer of said channel is doped with a material selected from the group consisting of selenium (Se), silicon (Si) and tin (Sn) to a concentration of approximately $5 \times 10^{16} - 2 \times 10^{17}$ ions/cm$^3$.

10. A hybrid transistor as in claim 4, in which the N-type layer of said channel is doped with a material selected from the group consisting of selenium (Se), silicon (Si) and tin (Sn) to a concentration of approximately $8 \times 10^{16}$ ions/cm$^3$.

11. A hybrid transistor as in claim 4, in which the P-type layer of said channel has a thickness of approximately 2,500–5,000 angstroms.

12. A hybrid transistor as in claim 4, in which the P-type layer of said channel has a thickness of approximately 3,000 angstroms.

13. A hybrid transistor as in claim 4, in which the P-type layer of said channel is doped with a material selected from the group consisting of beryllium (be) and zinc (Zn) to a concentration of approximately $10^{18}$–$10^{19}$ ions/cm$^3$.

14. A hybrid transistor as in claim 4, in which the P-type layer of said channel is doped with a material selected from the group consisting of beryllium (Be) and zinc (Zn) to a concentration of approximately $5 \times 10^{18}$ ions/cm$^3$.

15. A hybrid transistor, comprising:
vertical bipolar transistor means having a collector, an emitter and a floating base; and
junction-gate type field-effect transistor means having a lateral channel, means for directing current through said channel, and a vertical charge carrier injection path from the channel into the base of said vertical bipolar transistor means, said field-effect transistor means comprising a high electron mobility transistor (HEMT) structure.

16. A hybrid transistor, comprising:
vertical bipolar transistor means having a collector, an emitter and a floating base; and
junction-gate type field-effect transistor means having a lateral channel, means for directing current through said channel, and a vertical charge carrier injection path from the channel into the base of said vertical bipolar transistor means, said field-effect transistor means comprising a metal-semiconductor field-effect transistor (MESFET) structure.

17. A hybrid transistor, comprising:
vertical bipolar transistor means including:
an emitter layer of one conductivity type;
a floating base layer of opposite conductivity to said emitter layer formed over the emitter layer;
two laterally spaced, collector layers of like conductivity to said emitter layer which are formed over the base layer and define a lateral gap therebetween, a portion of the base layer extending into said gap to constitute an injection region; and
field-effect transistor means including:
a lateral channel of opposite conductivity to said emitter layer formed over said injection region; said channel comprising a high electron mobility transistor (HEMT) structure that includes:
a narrow bandgap material layer formed over the injection region; and
a wide bandgap material layer formed over the narrow bandgap material layer; and
a junction-type gate formed over the channel, the gate controlling vertical injection of electrons from the channel into said injection region of the base layer and thereby modulating the flow of current through the base layer.

18. A hybrid transistor as in claim 17, in which the narrow bandgap material layer and the wide bandgap material layer are formed of group III-V materials.

19. A hybrid transistor as in claim 17, in which the narrow bandgap material layer comprises gallium indium arsenide (GaInAs).

20. A hybrid transistor as in claim 19, in which the narrow bandgap material layer has a thickness of approximately 200–1,000 angstroms.

21. A hybrid transistor as in claim 19, in which the narrow bandgap material layer has a thickness of approximately 500 angstroms.

22. A hybrid transistor as in claim 19, in which the narrow bandgap material layer is intrinsic.

23. A hybrid transistor as in claim 17, in which the wide bandgap material layer comprises a material selected from the group consisting of aluminum gallium arsenide (AlGaAs) and aluminum indium arsenide (AlInAs).

24. A hybrid transistor as in claim 23, in which the wide bandgap material layer has a thickness of approximately 500–2,000 angstroms.

25. A hybrid transistor as in claim 23, in which the wide bandgap material layer has a thickness of approximately 1,000 angstroms.

26. A hybrid transistor as in claim 23, in which the wide bandgap material layer is doped with silicon (Si) to a concentration of approximately $2 \times 10^{17}$–$2 \times 10^{18}$ ions/cm$^3$.

27. A hybrid transistor as in claim 23, in which the wide bandgap material layer is doped with silicon to a concentration of approximately $5 \times 10^{17}$ ions/cm$^3$.

28. A hybrid transistor as in claim 23, in which the gate comprises a metal which forms a Schottky junction with the wide bandgap material layer.

29. A hybrid transistor, comprising:
vertical bipolar transistor means including:
an emitter layer of one conductivity type;
a floating base layer of opposite conductivity to said emitter layer formed over the emitter layer;
two laterally spaced, collector layers of like conductivity to said emitter layer which are formed over the base layer and define a lateral gap therebetween, a portion of the base layer extending into said gap to constitute an injection region; and
field-effect transistor means including:
a lateral channel of opposite conductivity to said emitter layer formed over said injection region; said channel comprising a metal semiconductor field-effect transistor (MESFET) structure that includes:
an N-type channel layer formed over the injection region; and
a Schottky layer formed over the channel layer; and
a junction-type gate formed over the channel, the gate controlling vertical injection of electrons from the channel into said injection region of the base layer and thereby modulating the flow of current through the base layer.

30. A hybrid transistor as in claim 29, in which the channel layer and the Schottky layer are formed of group III-V materials.

31. A hybrid transistor as in claim 30, in which the Schottky layer is formed of a material selected from the group consisting of gallium arsenide (GaAs) and aluminum gallium arsenide (AlGaAs).

32. A hybrid transistor as in claim 31, in which the Schottky layer is substantially intrinsic.

33. A hybrid transistor as in claim 31, in which the Schottky layer has a thickness of approximately 1,000–3,000 angstroms.

34. A hybrid transistor as in claim 31, in which the Schottky layer has a thickness of approximately 2,000 angstroms.

35. A hybrid transistor as in claim 30, in which the channel layer is formed of gallium indium arsenide (GaInAs).

36. A hybrid transistor as in claim 35, in which the channel layer has a thickness of approximately 300–1,000 angstroms.

37. A hybrid transistor as in claim 35, in which the channel layer has a thickness of approximately 500 angstroms.

38. A hybrid transistor as in claim 35, in which the channel layer is doped with silicon (Si) to a concentration of approximately $2\times10^{37}$–$10^{18}$ ions/cm$^3$.

39. A hybrid transistor as in claim 35, in which the channel layer is doped with silicon (Si) to a concentration of approximately $5\times10^{17}$ ions/cm$^3$.

40. A hybrid transistor as in claim 29, in which the channel layer is formed of a group III-V material and the Schottky layer is formed of a metal which forms a Schottky barrier with the channel layer.

41. A hybrid transistor as in claim 40, in which the channel layer is formed of gallium indium arsenide (GaInAs).

42. A hybrid transistor as in claim 41, in which the channel layer has a thickness of approximately 5,000–10,000 angstroms.

43. A hybrid transistor as in claim 41, in which the channel layer has a thickness of approximately 7,500 angstroms.

44. A hybrid transistor as in claim 41, in which the channel layer is doped with silicon (Si) to a concentration of approximately $5\times10^{17}$–$10^{18}$ ions/cm$^3$.

45. A hybrid transistor as in claim 41, in which the channel layer is doped with silicon (SiO to a concentration of approximately $7.5\times10^{17}$ ions/cm$^3$.

* * * * *